(12) United States Patent
Ma et al.

(10) Patent No.: US 10,290,520 B2
(45) Date of Patent: May 14, 2019

(54) METHOD FOR LAMINATING GLASS PANELS AND VACUUM LAMINATION DEVICE USING SAME

(71) Applicant: Shenzhen China Star Optoelectronics Technology Co., Ltd., Shenzhen, Guangdong (CN)

(72) Inventors: Tao Ma, Guangdong (CN); Tao Song, Guangdong (CN); Ming Liu, Guangdong (CN); Guodong Zhao, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 21 days.

(21) Appl. No.: 15/683,940

(22) Filed: Aug. 23, 2017

(65) Prior Publication Data
US 2017/0352561 A1    Dec. 7, 2017

Related U.S. Application Data

(62) Division of application No. 14/235,071, filed on Aug. 11, 2014, now Pat. No. 9,892,943.

(51) Int. Cl.
*B32B 37/10* (2006.01)
*H01L 21/67* (2006.01)
*B32B 38/18* (2006.01)
*B32B 38/00* (2006.01)

(52) U.S. Cl.
CPC .... *H01L 21/67115* (2013.01); *B32B 37/1018* (2013.01); *B32B 38/1841* (2013.01); *B32B 2037/1063* (2013.01); *B32B 2038/0076* (2013.01); *B32B 2309/68* (2013.01); *B32B 2310/0831* (2013.01); *B32B 2457/202* (2013.01)

(58) Field of Classification Search
CPC ................... B32B 2310/0831; G02F 1/1303
See application file for complete search history.

(56) References Cited

U.S. PATENT DOCUMENTS 7,897,003 B2 * 3/2011 Tashiro ................ G02F 1/1303
                                                             156/272.2
2007/0263161 A1 * 11/2007 Lin ....................... G02F 1/1339
                                                              349/153

FOREIGN PATENT DOCUMENTS

CN      1869794   * 11/2006
CN    202710884   *  1/2013

OTHER PUBLICATIONS

Machine translation of CN1869794 (Year: 2006).*
Machine translation of CN202710884 (Year: 2013).*

* cited by examiner

*Primary Examiner* — Scott W Dodds
(74) *Attorney, Agent, or Firm* — Andrew C. Cheng

(57) ABSTRACT

A method for laminating glass panels includes (1) providing a TFT substrate and a CF substrate to be laminated, in which the CF substrate is coated with a seal resin and the TFT substrate carries liquid crystal dropped thereon; (2) aligning and laminating the TFT substrate and the CF substrate in a vacuum environment to complete a lamination process; (3) applying UV light to transmit through the TFT substrate for carrying out UV curing of the seal resin interposed between the CF substrate and the TFT substrate so as to complete a UV curing process; and (4) removing the laminated CF substrate and the TFT substrate that have been subjected to the UV curing process out of the vacuum environment.

5 Claims, 5 Drawing Sheets

METHOD FOR LAMINATING GLASS PANELS AND VACUUM LAMINATION DEVICE USING SAME

CROSS REFERENCE TO RELATED APPLICATIONS

This is a divisional application of co-pending patent application Ser. No. 14/235,071, filed on Aug. 11, 2014, which is a national stage of PCT Application Number PCT/CN2013/079968, filed on Jul. 24, 2013, claiming foreign priority of Chinese Patent Application Number 201310293719.4, filed on Jul. 12, 2013.

BACKGROUND OF THE INVENTION

1. Field of the Invention

The present invention relates to the field of liquid crystal panel manufacturing, and in particular to a method for laminating glass panels and a vacuum lamination device using the method.

2. The Related Arts

Liquid crystal displays have a variety of advantages, such as thin device body, low power consumption, and being free of radiation, and are thus of wide applications, such as mobile phone, personal digital assistant (PDA), digital camera, computer monitor, and notebook computer screen.

Most of the liquid crystal displays that are currently available in the market are backlighting liquid crystal displays, which comprise an enclosure, a liquid crystal panel arranged in the enclosure, and a backlight module mounted in the enclosure. The structure of a conventional liquid crystal panel is composed of a color filter (CF) substrate, a thin-film transistor (TFT) array substrate, and a liquid crystal layer arranged between the two substrates and the operation principle is that a driving voltage is applied to the two glass substrates to control rotation direction of the liquid crystal molecules of the liquid crystal layer in order to refract out light emitting from the backlight module for generating images. Since the liquid crystal panel itself does not emit light, light must be provided from the backlight module in order to normally display images. Thus, the backlight module is one of the key components of a liquid crystal display. The backlight modules can be classified in two types, namely a side-edge backlight module and a direct backlight module, according to the position where light gets incident. The direct backlight module comprises a light source, such as a cold cathode fluorescent lamp (CCFL) or a light-emitting diode (LED), which is arranged at the backside of the liquid crystal panel to form a planar light source directly supplied to the liquid crystal panel. The side-edge backlight module comprises an LED light bar, serving as a backlight source, which is arranged at an edge of a backplane to be located rearward of one side of the liquid crystal panel. The LED light bar emits light that enters a light guide plate (LGP) through a light incident face at one side of the light guide plate and is projected out of a light emergence face of the light guide plate, after being reflected and diffused, to pass through an optic film assembly to form a planar light source for the liquid crystal panel.

Referring to FIG. 1, a schematic perspective view is given to show a conventional liquid crystal display, which comprises a backlight module 100, a mold frame 300 arranged on the backlight module 100, a liquid crystal display panel 500 arranged on the mold frame 300, and a bezel 700 mounted on the liquid crystal display panel 500. The backlight module 100 provides the liquid crystal display panel 500 with a planar light source of uniform illumination. The mold frame 300 carries and supports the liquid crystal display panel 500. The bezel 700 fixes the liquid crystal display panel 500 on the mold frame 300.

A general manufacturing process of liquid crystal display panel comprises a front stage of array process (including thin film, yellow light, etching, and film stripping), an intermediate stage of cell process (including bonding of TFT substrate and the CF substrate), and a rear stage of assembling process (including mounting of drive ICs and printed circuit board). The front stage of array process generally manufactures the TFT substrate in order to control the movement of liquid crystal molecules. The intermediate stage of cell process generally introduces liquid crystal between the TFT substrate and the CF substrate. The rear stage of assembling process generally mounts the drive ICs and combining the printed circuit board to effect driving the liquid crystal molecules to rotate for displaying images.

The conventional process of introducing liquid crystal between the TFT substrate and the CF substrate is generally a process referred to as one drop filling (ODF), of which the manufacturing process comprises: dropping a predetermined amount of liquid crystal on a TFT substrate on which a PI (Polyimide) film has been coated and laying a mold frame to show a designated pattern on a CF substrate on which a PI film has been coated, both being then forwarded into a vacuum lamination machine to be assembled together, followed by irradiation of UV (Ultraviolet) light to have the mold frame partially cured, and finally having them baked in an oven to have the mold frame to completely cured to compete the entire ODF process. In the process, the vacuum lamination and UV curing steps are of particularly importance for the product quality.

Referring to FIGS. 2-5, which illustrates a general process of vacuum lamination and UV curing that is conventionally used, specifically, the process comprises: firstly, laminating and assembling the TFT substrate 502 and the CF substrate 504 in a vacuum chamber in such a way that the precision of lamination is set to be of an error within ±5 um and may be within ±3 um for some high-end products, otherwise it might result in light leak of display, downgrading for poor quality product, or being directly disposed of. Then, a turn-over stage 503 is used to turn over the laminated TFT substrate 502 and the CF substrate 504 to prevent the UV light from incapable of irradiating seal resin 508 in the subsequent UV curing step due to the UV light being blocked by a black matrix (BM) 542 formed on the CF substrate 504. Finally, a UV lamp 505 and a UV mask 507 are used to irradiate the area of the seal resin 508 to cure the seal resin 508. The UV mask 507 shields the area of the liquid crystal 506 to avoid influence of the UV light on the property of the liquid crystal.

Such a conventional process has the following disadvantages:

(1) After the TFT substrate and the CF substrate have been laminated but before they are subjected to the irradiation of the UV light, since the seal resin has not yet been cured, turning over may result in a great deviation from the desired assembling precision due to the deformation of the substrates, so that the lamination precision may get larger than 5 um after the irradiation of the UV light and eventually, downgrading or disposal of the product ma result.

(2) Similarly, after the TFT substrate and the CF substrate have been laminated but before they are subjected to the irradiation of the UV light, since the seal resin has not yet been cured, if it would be of a long time (generally around 10 minutes) not subjecting to UV irradiation, molecules of the seal resin may get into the liquid crystal to cause contamination and affecting the performance of displaying; if the time is further extended, then the liquid crystal may penetrate through the seal resin to cause disposal of product, this generally occurring in abnormality of transporting device or malfunctioning of UV irradiating facility.

(3) Irradiation carried out with the UV irradiating facility is generally non-parallel light irradiation so that if size and location of an opening formed in a UV mask are not correct, then liquid crystal located around the seal resin may get exposed to irradiation of the UV light and reaction occurs. This makes it difficult to get a desired pre-tilt angle in a liquid crystal alignment step in the subsequent manufacturing process and leads to alignment abnormality of the product.

SUMMARY OF THE INVENTION

An object of the present invention is to provide a method for laminating glass panels, in which a glass panel lamination process and a UV curing process are combined together to effectively improve the yield rate of manufacturing and lower down the cost of manufacturing.

Another object of the present invention is to provide a vacuum lamination device that has a simple structure and a low cost and can effectively improve the manufacturing efficiency and yield rate of liquid crystal display panel.

To achieve the above objects, the present invention provides a method for laminating glass panels, which comprises the following steps:

(1) providing a TFT (Thin-Film Transistor) substrate and a CF (Color Filter) substrate to be laminated, the CF substrate being coated with a seal resin, the TFT substrate carrying liquid crystal dropped thereon;

(2) aligning and laminating the TFT substrate and the CF substrate in a vacuum environment to complete a lamination process;

(3) applying UV (Ultraviolet) light to transmit through the TFT substrate for carrying out UV curing of the seal resin interposed between the laminated CF substrate and TFT substrate so as to complete a UV curing process; and (4) removing the laminated CF substrate and the TFT substrate that have been subjected to the UV curing process out of the vacuum environment.

Step (2) specifically comprises: providing a vacuum chamber, an upper positioning plate, and a lower positioning plate, wherein the lower positioning plate is made of quartz glass, attracting and holding the CF substrate on the upper positioning plate, attracting and holding the TFT substrate on the lower positioning plate, and moving the upper positioning plate and the lower positioning plate relative to each other in the vacuum chamber until the CF substrate and the TFT substrate are aligned and laminated together.

The upper positioning plate is made of a metal material. The upper positioning plate attracts and holds the CF substrate through adhesive attachment or electrostatic attraction. The quartz glass that makes the lower positioning plate has a content of hydroxyl that is smaller than or equal to 60 ppm. The lower positioning plate attracts and holds the TFT substrate through vacuum attraction.

Step (3) specifically comprises: providing a UV lamp, a light guide plate, and a UV mask, wherein the UV lamp is arranged outside the vacuum chamber and the light guide plate and the UV mask are arranged inside the vacuum chamber, whereby the UV lamp emits UV light and the UV lights transmits into the light guide plate and converts into a planar light source to sequentially transmit through the UV mask, the lower positioning plate, and the TFT substrate to irradiate the seal resin so as to achieve curing of the seal resin.

Step (3) further comprises: providing a prism plate, whereby UV light projecting from the light guide plate is allowed to transmit through the prism plate and is projected, in a direction substantially normal to the light guide plate, toward the UV mask to subsequently transmit through the lower positioning plate and the TFT substrate to irradiate the seal resin and achieve curing of the seal resin.

The present invention also provides a vacuum lamination device, which comprises: a vacuum chamber, an upper positioning plate and a lower positioning plate mounted in the vacuum chamber and movable with respect to each other, a UV mask mounted to a surface of the lower positioning plate that is distant from the upper positioning plate, a prism plate mounted in the vacuum chamber and located below the UV mask, a light guide plate arranged in the vacuum chamber and located below the prism plate, a UV lamp arranged outside the vacuum chamber and located at one side of the light guide plate, and a plurality of reflection plates arranged at an outer circumference of the light guide plate. The upper positioning plate functions to attract and hold a CF substrate. The lower positioning plate is made of a transparent material for attracting and holding a TFT substrate. The upper positioning plate and the lower positioning plate are movable toward each other to laminate the CF substrate and the TFT substrate together. The UV lamp emits a UV light that sequentially transmits through the light guide plate, the prism plate, the UV mask, the lower positioning plate, and the TFT substrate to irradiate seal resin interposed between the CF substrate and the TFT substrate so as to achieve vacuum lamination of the CF substrate and the TFT substrate and UV curing.

The upper positioning plate is made of a metal material. The upper positioning plate attracts and holds the CF substrate through adhesive attachment or electrostatic attraction. The lower positioning plate is made of quartz glass and the quartz glass has a content of hydroxyl that is smaller than or equal to 60 ppm. The lower positioning plate attracts and holds the TFT substrate through vacuum attraction. The UV mask is mounted through vacuum suction to the lower positioning plate.

The UV lamp comprises a UV emitter and a reflection hood arranged outside and around the UV emitter. The reflection hood has two ends respectively located at upper and lower sides of the light guide plate.

The light guide plate is made of quartz glass and the quartz glass has a content of hydroxyl that is smaller than or equal to 60 ppm. The light guide plate comprises: a light exit surface facing the prism plate, a bottom surface opposite to the light exit surface, and a plurality of lateral surfaces between the light exit surface and the bottom surface. The plurality of lateral surfaces comprises at least a light incident surface. The bottom surface of the light guide plate comprises a plurality of optic structures uniformly distributed thereon. The optic structures comprise concave hemispherical structures. The prism plate is made of quartz glass that has a content of hydroxyl that is smaller than or equal to 60 ppm. The prism plate has an upper surface that is formed of a serration structure, whereby the UV light, after being filtered by the prism plate is projected in a vertical direction.

The light guide plate comprises a light incident surface. The UV lamp is set at the light incident surface of the light guide plate. The reflection plates are of a number of four respectively set at the remaining three lateral surfaces, except the light incident surface, of the light guide plate and the bottom surface.

The present invention further provides a vacuum lamination device, which comprises: a vacuum chamber, an upper positioning plate and a lower positioning plate mounted in the vacuum chamber and movable with respect to each other, a UV mask mounted to a surface of the lower positioning plate that is distant from the upper positioning plate, a prism plate mounted in the vacuum chamber and located below the UV mask, a light guide plate arranged in the vacuum chamber and located below the prism plate, a UV lamp arranged outside the vacuum chamber and located at one side of the light guide plate, and a plurality of reflection plates arranged at an outer circumference of the light guide plate, the upper positioning plate functioning to attract and hold a CF substrate, the lower positioning plate being made of a transparent material for attracting and holding a TFT substrate, the upper positioning plate and the lower positioning plate being movable toward each other to laminate the CF substrate and the TFT substrate together, the UV lamp emitting a UV light that sequentially transmits through the light guide plate, the prism plate, the UV mask, the lower positioning plate, and the TFT substrate to irradiate seal resin interposed between the CF substrate and the TFT substrate so as to achieve vacuum lamination of the CF substrate and the TFT substrate and UV curing;

wherein the upper positioning plate is made of a metal material, the upper positioning plate attracting and holding the CF substrate through adhesive attachment or electrostatic attraction, the lower positioning plate being made of quartz glass, the quartz glass having a content of hydroxyl that is smaller than or equal to 60 ppm, the lower positioning plate attracting and holding the TFT substrate through vacuum attraction, the UV mask being mounted through vacuum suction to the lower positioning plate; and wherein the UV lamp comprises a UV emitter and a reflection hood arranged outside and around the UV emitter, the reflection hood having two ends respectively located at upper and lower sides of the light guide plate.

The light guide plate is made of quartz glass and the quartz glass has a content of hydroxyl that is smaller than or equal to 60 ppm. The light guide plate comprises: a light exit surface facing the prism plate, a bottom surface opposite to the light exit surface, and a plurality of lateral surfaces between the light exit surface and the bottom surface. The plurality of lateral surfaces comprises at least a light incident surface. The bottom surface of the light guide plate comprises a plurality of optic structures uniformly distributed thereon. The optic structures comprise concave hemispherical structures. The prism plate is made of quartz glass that has a content of hydroxyl that is smaller than or equal to 60 ppm. The prism plate has an upper surface that is formed of a serration structure, whereby the UV light, after being filtered by the prism plate is projected in a vertical direction.

The light guide plate comprises a light incident surface. The UV lamp is set at the light incident surface of the light guide plate. The reflection plates are of a number of four respectively set at the remaining three lateral surfaces, except the light incident surface, of the light guide plate and the bottom surface.

The efficacy of the present invention is that the present invention provides a method for laminating glass panels and a vacuum lamination device using the method, which effectively lowers down the manufacture cost and improve the yield rate, wherein specifically, a UV lamp module is arranged under a lower positioning plate of the vacuum lamination device to directly irradiate UV light after vacuum lamination of the CF substrate and the TFT substrate in order to cure the seal resin to thereby eliminate the occurrence of downgrading or disposal of product in the conventional process where laminated CF substrate and TFT substrate must be removed out and subjected to turning over, which leads to deformation of the substrates, before UV irradiation can be performed and also effectively shorten the time between lamination and irradiation of UV light to thereby avoid the occurrence of contamination of the liquid crystal by the seal resin or penetration of the liquid crystal through the seal resin due to an excessively long time interval between the two processes. Further, with the arrangement of a prism plate to subject the UV light to filtration, the light that is projected to the TFT substrate is substantially perpendicular to the TFT substrate so as to avoid irradiation of liquid crystal around a seal resin by the UV light due to inappropriate arrangement of sizes and locations of openings of a UV mask and reaction resulting therefrom, which lead to incapability of obtaining a desired pre-tilt angle for alignment operation of liquid crystal in the subsequent process and thus abnormal alignment of the product.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of embodiments of the present invention, with reference to the attached drawing. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
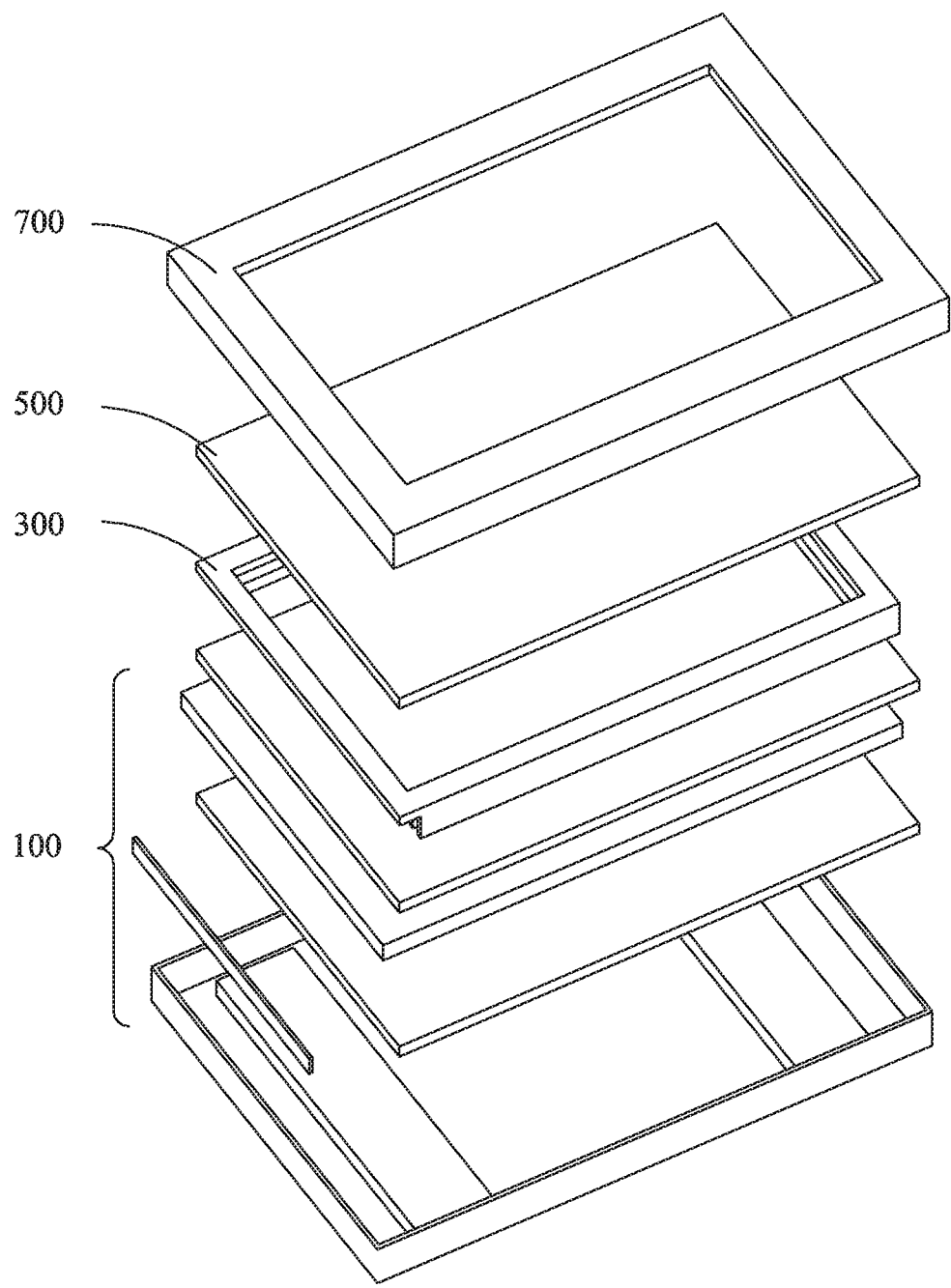
FIG. 1 is a schematic perspective view showing a conventional liquid crystal display.
Figure 2:
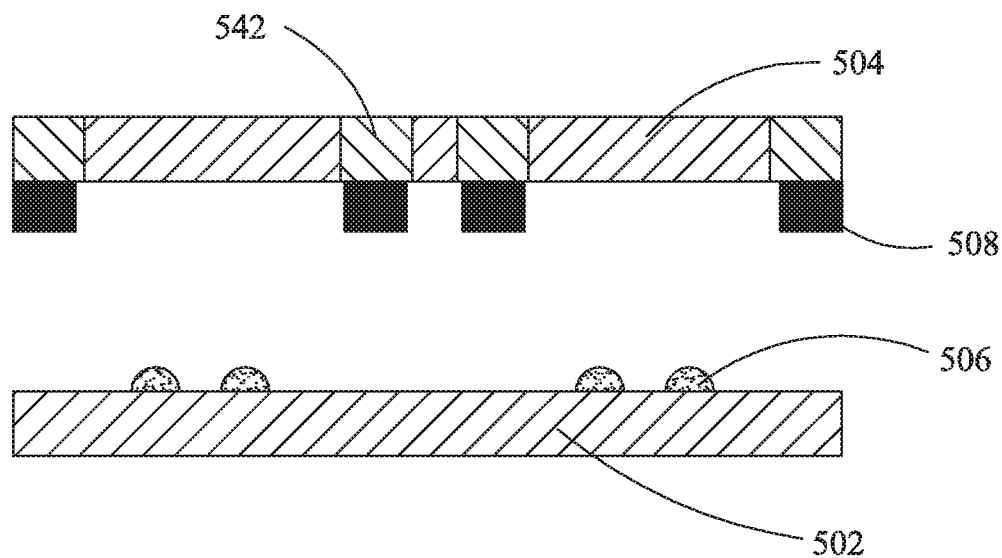
FIGS. 2-5 are schematic views illustrating a conventional process of vacuum lamination and UV curing.
Figure 3:
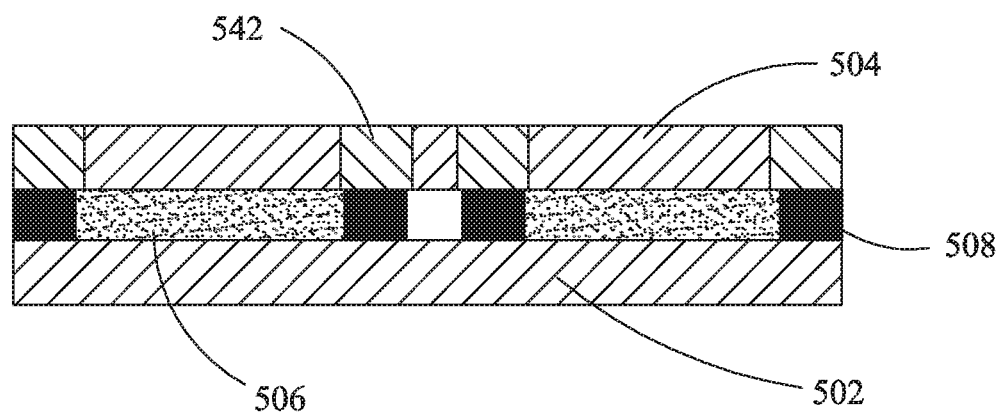
Figure 4:
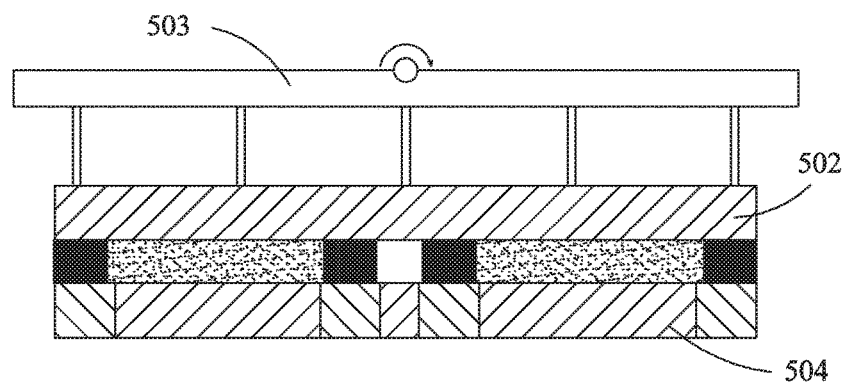
Figure 5:
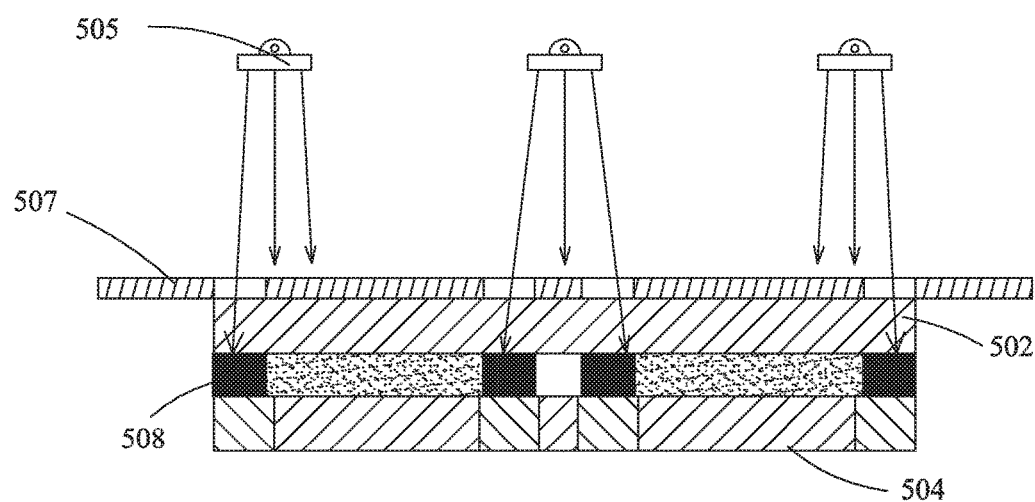
Figure 6:
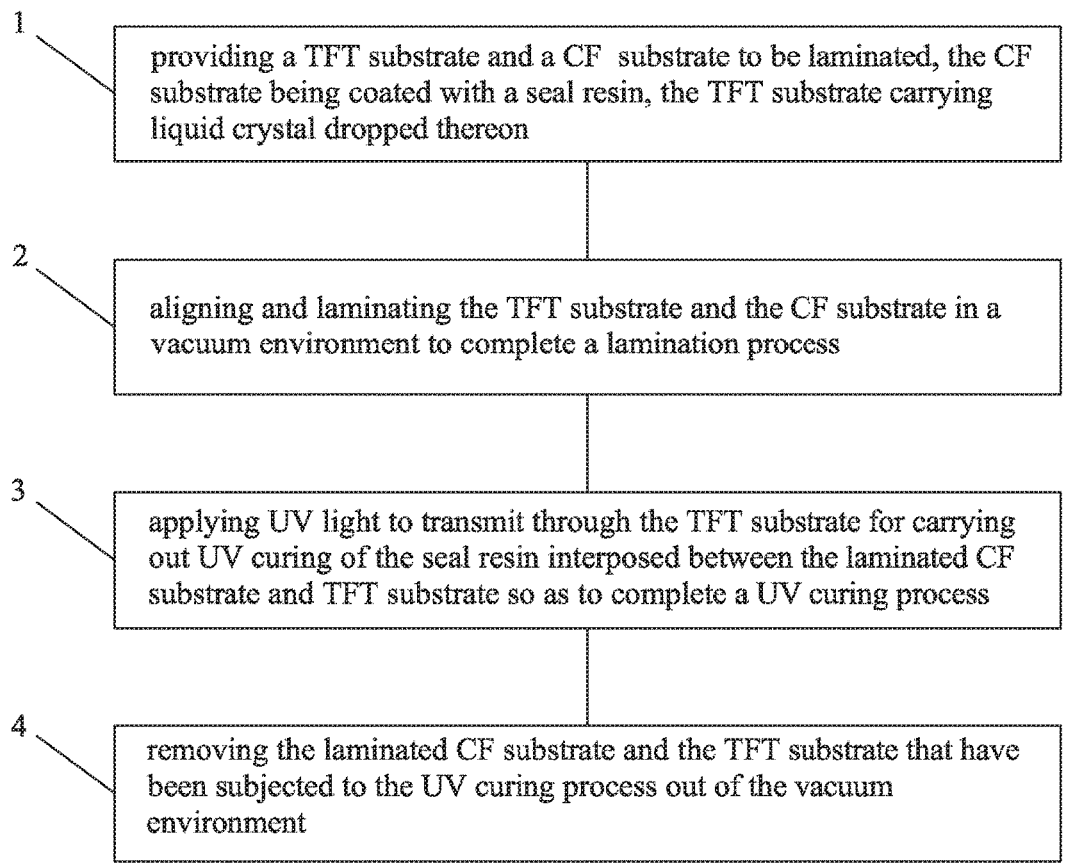
FIG. 6 is a flow chart illustrating a method for laminating glass panels the present invention.
Figure 7:
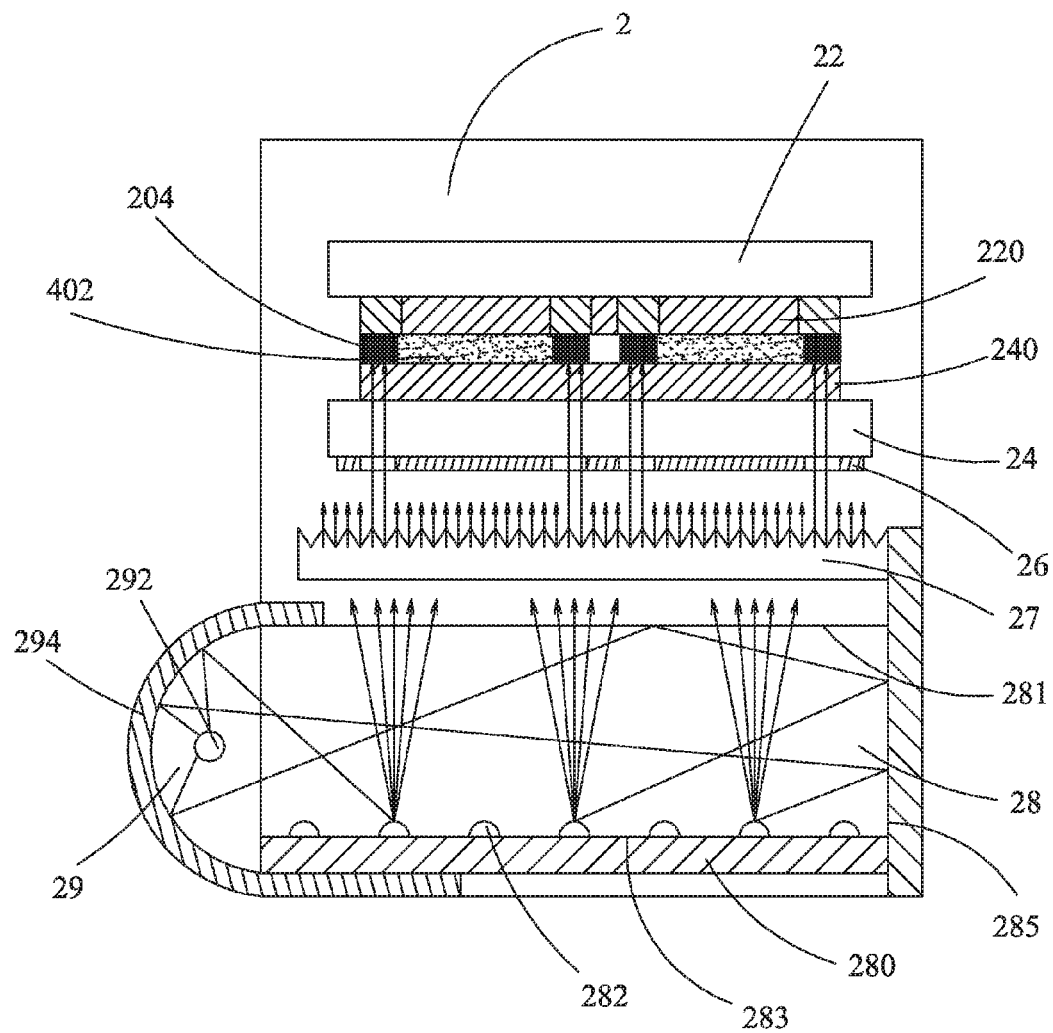
FIG. 7 is a schematic view illustrating a vacuum lamination device according to the present invention in operation in laminating a CF substrate and a TFT substrate.

Referring to FIG. 6, with additional reference to FIG. 7, the present invention provides a method for laminating glass panels, which specifically comprises the following steps:

Step 1: providing a TFT (Thin-Film Transistor) substrate 240 and a CF (Color Filter) substrate 220 to be laminated, the CF substrate 220 being coated with a seal resin 204, the TFT substrate 240 carrying liquid crystal 402 dropped thereon.

Step 2: aligning and laminating the TFT substrate 240 and the CF substrate 220 in a vacuum environment to complete a lamination process.

Step 2 specifically comprises: providing a vacuum chamber 2, an upper positioning plate 22, and a lower positioning plate 24, wherein the lower positioning plate 24 is made of quartz glass, attracting and holding the CF substrate 220 on the upper positioning plate 22, attracting and holding the TFT substrate 240 on the lower positioning plate 24, and moving the upper positioning plate 22 and the lower positioning plate 24 relative to each other in the vacuum chamber 2 until the CF substrate 220 and the TFT substrate 240 are aligned and laminated together.

Preferably, the upper positioning plate 22 is made of a metal material. The way that the upper positioning plate 22 attracts and holds the CF substrate 220 is adhesive attachment or electrostatic attraction. The lower positioning plate 24 is preferably made of quartz glass. The quartz glass has a content of hydroxyl (—OH) that is smaller than or equal to 60 ppm to allow the transmittance of ultraviolet light to be greater than or equal to 90% and has an effective utilization time that exceeds 2,000 hours where the transmittance is lowered to 80% of the initial level so as to not affect the transmittance of UV light. The way that the lower positioning plate 24 attracts and holds the TFT substrate 240 is vacuum attraction. In other words, the lower positioning plate 24 is provided with uniform apertures (not shown) and is coupled to a vacuum pipe line whereby a electromagnetic vacuum valve (not shown) can be used to control if the TFT substrate 240 is attracted and held or not.

Step 3: applying UV (Ultraviolet) light to transmit through the TFT substrate 240 for carrying out UV curing of the seal resin 204 interposed between the laminated CF substrate 220 and TFT substrate 240 so as to complete a UV curing process.

Step 3 specifically comprises: providing a UV lamp 29, a light guide plate 28, and a UV mask 26, wherein the UV lamp 29 is arranged outside the vacuum chamber 2 and the light guide plate 28 and the UV mask 26 are arranged inside the vacuum chamber 2, whereby the UV lamp 29 emits UV light and the UV lights transmits into the light guide plate 28 and converts into a planar light source to sequentially transmit through the UV mask 26, the lower positioning plate 24, and the TFT substrate 240 to irradiate the seal resin 204 so as to achieve curing of the seal resin 204.

Step 3 further comprises: providing a prism plate 27, whereby UV light projecting from the light guide plate 28 is allowed to transmit through the prism plate 27 and is projected, in a direction substantially normal to the light guide plate 28, toward the UV mask 26 to subsequently transmit through the lower positioning plate 24 and the TFT substrate 240 to irradiate the seal resin 204 and achieve curing of the seal resin 204.

Preferably, the light guide plate 28 is made of quartz glass and the quartz glass has a content of hydroxyl that is smaller than or equal to 60 ppm. The light guide plate 28 comprises: a light exit surface 281 facing the prism plate 27, a bottom surface 283 opposite to the light exit surface 281, and a plurality of lateral surfaces 285 between the light exit surface 281 and the bottom surface 283. The plurality of lateral surfaces 285 comprises at least a light incident surface. The bottom surface 283 of the light guide plate 28 comprises a plurality of the optic structures 282 uniformly distributed thereon for dispersing the UV light reflected by the reflection plate 280 so as to have the light transmit toward the light exit surface 281 of the light guide plate 28. In the instant embodiment, the optic structures 282 are concave hemispherical structures.

The prism plate 27 is made of quartz glass and the quartz glass has a content of hydroxyl that is smaller than or equal to 60 ppm. The prism plate 27 has an upper surface that is formed of a serration structure, whereby the UV light, after being filtered by the prism plate 27 is projected in a vertical direction to have the light perpendicularly projecting to the UV mask 26 for improving precision and preventing the liquid crystal 402 around the seal resin 204 from being irradiated by the UV light and resulting in reaction.

Step 4: removing the laminated CF substrate 220 and the TFT substrate 240 that have been subjected to the UV curing process out of the vacuum environment.

A robotic arm is used to remove the laminated CF substrate 220 and TFT substrate 240 out of the vacuum chamber 2 and to forward it to a heating oven to have the seal resin 204 further cured.

The method for laminating glass panels according to the present invention allows the seal resin 204 to be subjected to UV curing after the CF substrate 220 and the TFT substrate 240 has been laminated without the need of turning over so as to effectively eliminate the occurrence of downgrading or disposal of product in the conventional process where laminated CF substrate and TFT substrate must be removed out and subjected to turning over, which leads to deformation of the substrates, before UV irradiation can be performed and also effectively shorten the time between lamination and irradiation of UV light to thereby avoid the occurrence of contamination of the liquid crystal by the seal resin or penetration of the liquid crystal through the seal resin due to an excessively long time interval between the two processes.

Referring to FIG. 7, the present invention further provides a vacuum lamination device, which comprises: a vacuum chamber 2, an upper positioning plate 22 and a lower positioning plate 24 mounted in the vacuum chamber 2 and movable with respect to each other, a UV mask 26 mounted to a surface of the lower positioning plate 24 that is distant from the upper positioning plate 22, a prism plate 27 mounted in the vacuum chamber 2 and located below the UV mask 26, a light guide plate 28 arranged in the vacuum chamber 2 and located below the prism plate 27, a UV lamp 29 arranged outside the vacuum chamber 2 and located at one side of the light guide plate 28, and a plurality of reflection plates 280 arranged at an outer circumference of the light guide plate 28. After vacuum lamination of a CF substrate 220 and a TFT substrate 240 that are respectively attracted and held on the upper and lower positioning plates 22, 24, the UV lamp 29 emits a UV light that transmits through the light guide plate 28, the prism plate 27, and the UV mask 26 to irradiate the seal resin 204 interposed between the CF substrate 220 and the TFT substrate 240 to achieve UV curing of the CF substrate 220 and the TFT substrate 240. The present invention effectively combines UV curing facility in an existing vacuum lamination device to allow the two processes of vacuum lamination and UV curing to be carried out in the vacuum lamination device thereby effectively shortening the manufacturing time and lowering the manufacturing cost and also improving product quality.

In the instant embodiment, the upper positioning plate 22 is made of a metal material for attracting and holding the CF substrate 220. The lower positioning plate 24 is made of a transparent material for attracting and holding the TFT substrate 240. The lower positioning plate 24 is preferably made of quartz glass. The quartz glass has a content of hydroxyl (—OH) that is smaller than or equal to 60 ppm to allow the transmittance of ultraviolet light to be greater than or equal to 90% and has an effective utilization time that exceeds 2,000 hours where the transmittance is lowered to 80% of the initial level so as to not affect the transmittance of UV light. The upper positioning plate 22 and the lower positioning plate 24 are movable towards each other to have the CF substrate 220 and the TFT substrate 240 attracted and held thereon laminated together to complete the vacuum lamination process.

Preferably, the way that the upper positioning plate 22 attracts and holds the CF substrate 220 is adhesive attachment or electrostatic attraction and the way that the lower positioning plate 24 attracts and holds the TFT substrate 240 is vacuum attraction. In other words, the lower positioning plate 24 is provided with uniform apertures (not shown) and is coupled to a vacuum pipe line whereby a electromagnetic vacuum valve (not shown) can be used to control if the TFT substrate 240 is attracted and held or not.

The UV mask 26 can be of different specifications according to the sizes of liquid crystal display panel. The UV mask 26 is mounted to the lower positioning plate 24 through vacuum suction so that the UV mask 26 can be replaced with different ones according to the sizes of the liquid crystal display panels with easy mounting and dismounting operations.

The light guide plate 28 is made of quartz glass and the quartz glass has a content of hydroxyl that is smaller than or equal to 60 ppm. The light guide plate 28 comprises: a light exit surface 281 facing the prism plate 27, a bottom surface 283 opposite to the light exit surface 281, and a plurality of lateral surfaces 285 between the light exit surface 281 and the bottom surface 283. The plurality of lateral surfaces 285 comprises at least a light incident surface. The bottom surface 283 of the light guide plate 28 comprises a plurality of optic structures 282 uniformly distributed thereon for dispersing the UV light reflected by the reflection plate 280 so as to have the light transmit toward the light exit surface 281 of the light guide plate 28. In the instant embodiment, the optic structures 282 are concave hemispherical structures.

The prism plate 27 is made of quartz glass and the quartz glass has a content of hydroxyl that is smaller than or equal to 60 ppm. The prism plate 27 has an upper surface that is formed of a serration structure, whereby the UV light, after being filtered by the prism plate 27 is projected in a vertical direction to have the light perpendicularly projecting to the UV mask 26 for improving precision and preventing the liquid crystal 402 around the seal resin 204 from being irradiated by the UV light and resulting in reaction.

The UV lamp 29 is arranged outside the vacuum chamber 2 and is coupled to the vacuum chamber 2 through hermetic enclosure to prevent temperature rise caused by the excessive amount of heat emission during the operation of the UV lamp 29 from causing excessive amounts of deformation of the substrates that affect the precision of lamination. The UV lamp 29 comprises a UV emitter 292 and a reflection hood 294 arranged outside and around the UV emitter 292. The reflection hood 294 is of a curved shape and has two ends respectively located at upper and lower sides of the light guide plate 28 to reflect the UV light emitting from the UV emitter 292 toward the light incident surface of the light guide plate 28 so as to increase the utilization of the UV light.

The quantities of the UV lamp 29 and the reflection plate 280 can be selected according to practical needs. In the instant embodiment, the light guide plate 28 comprises a light incident surface and the quantity of UV lamp 29 used is one. The UV lamp 29 is set at one side of the light incident surface. The number of reflection plate 280 used is four, respectively set at the remaining three lateral surfaces 285, except the light incident surface, of the light guide plate 28 and the bottom surface 283 for reflecting light backward to have the light eventually projecting out through the light exit surface thereby increasing the utilization of the UV light.

In summary, the present invention provides a method for laminating glass panels and a vacuum lamination device using the method, which effectively lowers down the manufacture cost and improve the yield rate, wherein specifically, a UV lamp module is arranged under a lower positioning plate of the vacuum lamination device to directly irradiate UV light after vacuum lamination of the CF substrate and the TFT substrate in order to cure the seal resin to thereby eliminate the occurrence of downgrading or disposal of product in the conventional process where laminated CF substrate and TFT substrate must be removed out and subjected to turning over, which leads to deformation of the substrates, before UV irradiation can be performed and also effectively shorten the time between lamination and irradiation of UV light to thereby avoid the occurrence of contamination of the liquid crystal by the seal resin or penetration of the liquid crystal through the seal resin due to an excessively long time interval between the two processes. Further, with the arrangement of a prism plate to subject the UV light to filtration, the light that is projected to the TFT substrate is substantially perpendicular to the TFT substrate so as to avoid irradiation of liquid crystal around a seal resin by the UV light due to inappropriate arrangement of sizes and locations of openings of a UV mask and reaction resulting therefrom, which lead to incapability of obtaining a desired pre-tilt angle for alignment operation of liquid crystal in the subsequent process and thus abnormal alignment of the product.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for laminating glass panels, comprising the following steps:
    (1) providing a thin-film transistor (TFT) substrate and a color filter (CF) substrate to be laminated, the CF substrate being coated with a seal resin, the TFT substrate carrying liquid crystal dropped thereon;
    (2) aligning and laminating the TFT substrate and the CF substrate in a vacuum environment defined in a vacuum chamber to complete a lamination process;
    (3) applying ultraviolet (UV) light to transmit through the TFT substrate for carrying out UV curing of the seal resin interposed between the laminated CF substrate and TFT substrate so as to complete a UV curing process; and
    (4) removing the laminated CF substrate and the TFT substrate that have been subjected to the UV curing process out of the vacuum environment;
    wherein step (3) comprises: providing a UV lamp, a light guide plate, a lower positioning plate, and a UV mask, wherein the UV lamp emits UV light that transmits into the light guide plate to be converted into a planar light source to sequentially transmit through the UV mask, the lower positioning plate, and the TFT substrate to irradiate the seal resin so as to achieve curing of the seal resin, wherein the light guide plate comprises a light exit surface facing in a direction toward the TFT substrate, a bottom surface opposite to the light exit surface and distant from the TFT substrate, and a light incidence surface between the light exit surface and the bottom surface to receive the UV light from UV lamp to transmit into the light guide plate, the bottom surface of the light guide plate comprising a plurality of optic structures uniformly distributed thereon, the optic structures comprising concave hemispherical structures, so as to redirect and project the UV light that transmits through the light incidence surface into the light guide plate to travel in a direction toward the TFT substrate to carry out UV curing of the seal resin.

2. The method for laminating glass panels as claimed in claim 1, wherein step (2) specifically comprises: providing an upper positioning plate, wherein the lower positioning plate is made of quartz glass, attracting and holding the CF substrate on the upper positioning plate, attracting and holding the TFT substrate on the lower positioning plate, and moving the upper positioning plate and the lower positioning plate relative to each other in the vacuum chamber until the CF substrate and the TFT substrate are aligned and laminated together.

3. The method for laminating glass panels as claimed in claim 2, wherein the upper positioning plate is made of a metal material, the upper positioning plate attracting and holding the CF substrate through adhesive attachment or electrostatic attraction, the quartz glass that makes the lower positioning plate having a content of hydroxyl that is smaller than or equal to 60 ppm, the lower positioning plate attracting and holding the TFT substrate through vacuum attraction.

4. The method for laminating glass panels as claimed in claim 3, wherein wherein the UV lamp is arranged outside the vacuum chamber and the light guide plate and the UV mask are arranged inside the vacuum chamber.

5. The method for laminating glass panels as claimed in claim 1, wherein step (3) further comprises: providing a prism plate, such that the UV light projecting from the light guide plate transmits through the prism plate to be projected, in a direction substantially normal to the light guide plate, toward the UV mask to subsequently transmit through the lower positioning plate and the TFT substrate to irradiate the seal resin and achieve curing of the seal resin.

* * * * *